United States Patent [19]

Uchida et al.

[11] 3,950,737
[45] Apr. 13, 1976

[54] NONVOLATILE COUNTER CIRCUIT

[75] Inventors: Yukimasa Uchida; Isao Nojima; Yoshiaki Matsuno, all of Yokohama, Japan

[73] Assignee: Tokyo Shibaura Electric Co., Ltd., Tokyo, Japan

[22] Filed: Sept. 26, 1974

[21] Appl. No.: 509,490

[30] Foreign Application Priority Data

Sept. 28, 1973 Japan.............................. 48-109005

[52] U.S. Cl. ... 340/173 FF; 307/221 C; 307/224 C; 307/238; 307/279
[51] Int. Cl.[2] .................. G11C 11/40; G11C 13/00
[58] Field of Search .................. 340/173 R, 173 FF; 307/238, 279, 221 C, 224 C

[56] References Cited
UNITED STATES PATENTS 3,679,913  7/1972  Fultz ............................ 340/173 FF
3,745,540  7/1973  Taniguchi..................... 340/173 FF Primary Examiner—Terrell W. Fears
Attorney, Agent, or Firm—Oblon, Fisher, Spivak, McClelland & Maier

[57] ABSTRACT

A nonvolatile counter circuit is disclosed which includes a nonvolatile insulated gate type field effect memory transistor interposed between the load and active elements of a flip-flop circuit. A switching element is connected in parallel with the memory transistor and a circuit is provided for returning information stored in the nonvolatile memory transistor to the flip-flop after the circuit power source has been turned on. A circuit is also provided for erasing the information stored in the nonvolatile memory transistor. A circuit element is provided for short-circuiting the switching element, and a circuit is provided for writing the information stored in the flip-flop circuit into the nonvolatile memory transistor at the transient of switching off the power.

13 Claims, 7 Drawing Figures

NONVOLATILE COUNTER CIRCUIT

BACKGROUND OF THE INVENTION

1. Field of the Invention

The present invention relates, in general, to a counter circuit, and in particular, to a nonvolatile counter circuit which stores information without loss even if power is cut off.

2. Description of the Prior Art

Nonvolatile counter circuits utilizing nonvolatile insulated gate type field effect memory transistors, such as MNOS (Metal-Nitride-Oxide-Semiconductor), as elememtents of flip-flops which constitute each bit of a binary counter have been proposed in the past. Representative circuits of this type are disclosed in the Oct. 23, 1972 issue of "Electronics", pp. 119–123 under the title "Metal-Nitride-Oxide IC Memory Retains Data for Meter Reader".

As is well known in the art, the MNOS transistor has a dual gate structure consisting of a metal layer, a $Si_3N_4$ layer and a $SiO_2$ layer.

Carriers are injected from the substrate into traps which exist in the vicinity of the boundary of the $Si_3N_4$ layer and the $SiO_2$ layer by the tunneling phenomenon. The storage of injected carriers in traps is utilized for nonvolatile information storage. Binary values "1" and "0" are stored as values of threshold voltage of the transistor. More specifically, the nonvolatile counter circuits have such a configuration that the MNOS transistor is interposed between a load MOS transistor and a switching MOS transistor of a flip-flop circuit. The information stored in the MNOS transistors is erased at every count input and new information from the flip-flop is written into the MNOS transistors. Thus, it is possible to store information in the counter even if the power supply is cut off. However, the information stored in the MNOS transistors is rewritten at every count input, so the MNOS transistors are apt to gradually deteriorate. That is, the difference in the threshold voltages corresponding to each binary value becomes extremely small after $10^{10}$ rewriting operations. Further, deterioration appears in the memory holding characteristics of the device. This deterioration is understood to be based on the appearance of a high density surface level in the vicinity of the boundary between the thin oxide layer and the substrate of the MNOS transistor. These deteriorations are rather essential and can not be avoided with the present technology. These deteriorations can also be observed when the writing voltage is applied to the gate of the MNOS transistor for a long time, for example $10^4$ sec, even through the frequency of re-writing is small.

A second defect of known counter circuits lies in the low operating frequency of the counter. This is due to the fact that several tens to several hundreds of microseconds are required to write information into the MNOS transistor. Thus, the maximum operating frequency of the counter circuit is only on the order of several kHz.

SUMMARY OF THE INVENTION

Accordingly, it is one object of the present invention to provide a new and improved nonvolatile counter circuit which stores information without loss even when power is cut off.

Another object of the present invention is to provide a new and improved nonvolatile counter circuit which eliminates the above described types of deterioration common to memory transistors and to thereby provide a nonvolatile counter circuit of improved reliability.

Still another object of the present invention is to provide a new and improved nonvolatile counter circuit capable of higher operating frequencies than conventional devices.

A still further object of the present invention is to provide a new and improved nonvolatile counter circuit having improved stability of operation.

Briefly, in accordance with the invention, the foregoing and other objects are attained by a nonvolatile counter circuit comprising a nonvolatile insulated gate type field effect memory transistor which is interposed between a load and an active element of a flip-flop which constitutes each bit of a binary code. A switching element is connected in parallel with the memory transistor and means is provided for retrieving information stored in the memory transistor and feeding it into the flip-flop after detecting the "on" state of the power source. Means are also provided for erasing the information stored in the memory transistor. An additional means is provided for short-circuiting the switching element and means are also provided for writing the information stored in the flip-flop into the memory transistor after detecting the "off" state of the power source.

BRIEF DESCRIPTION OF THE DRAWINGS

These and other objects and features of the invention will be better understood by reference to the following detailed description when considered in connection with the accompanying drawings, wherein.

DETAILED DESCRIPTION OF THE PREFERRED EMBODIMENTS

Figure 1:
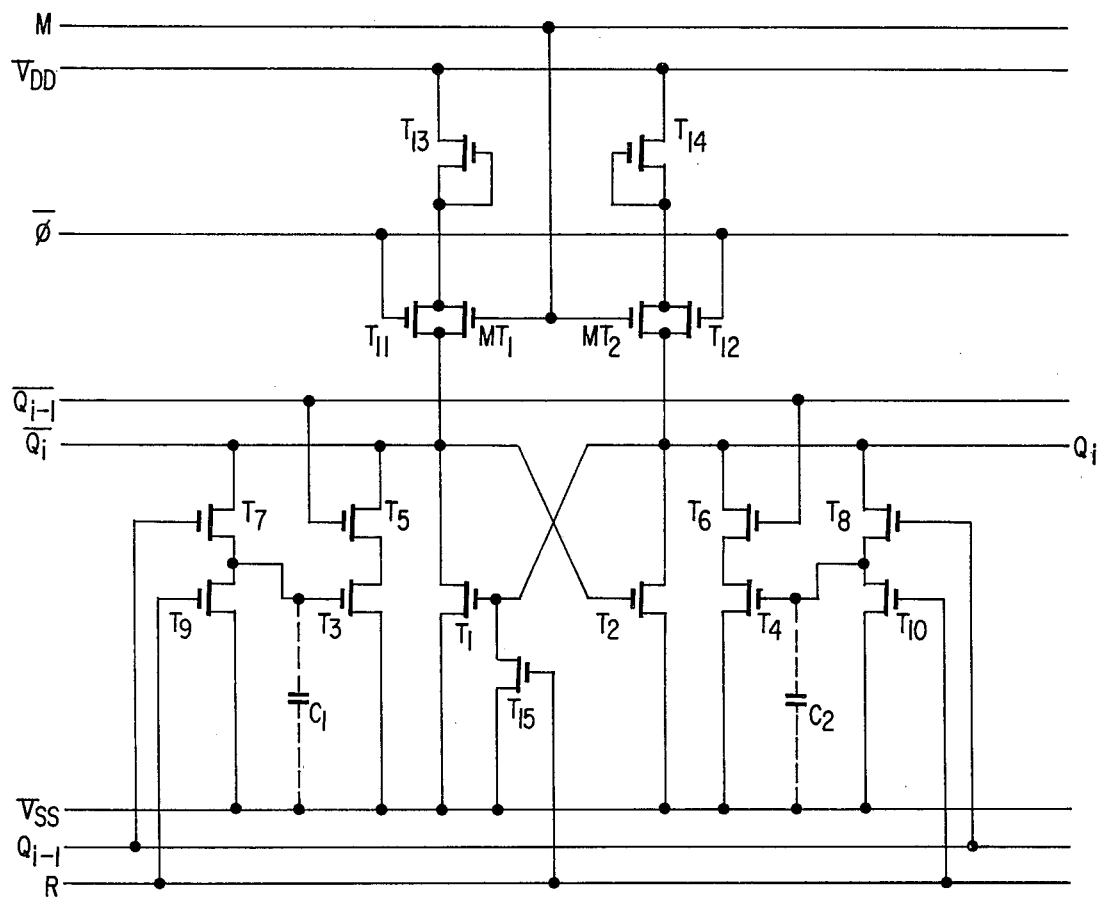
FIG. 1 is a circuit diagram representing a part of one embodiment of a nonvolatile counter circuit according to the present invention in which the illustrated circuit is a basic one bit unit of a complete counter circuit.

Referring now to the drawings, wherein like reference numerals indicate identical or corresponding parts throughout the several views and more particularly to FIG. 1 thereof, there is shown a binary one bit (flip-flop) circuit which is a basic construction unit of the nonvolatile counter circuit of the present invention.

The circuit comprises memory transistors MT1 and MT2, for example P channel MNOS transistors, having their gates tied together and fed by a control signal M. Drains of the transistors MT1 and MT2 are connected to load elements, that is, MOS transistors T13 and T14 respectively and the sources thereof are connected to active elements for switching the flip-flop, that is, are connected to drains of MOS transistors T1 and T2 respectively. The gate of the transistor T1 is connected to the drain of the transistor T2 and the gate of the transistor T2 is connected to the drain of the transistor T1. Transistors T15 is used for clearing the counter.

The transistors T3 and T5, are connected in series with each other and are coupled to the transistor T1 in parallel. The transistors T4 and T6 are connected in series with each other and are coupled to the transistor T2 in parallel. The transistors T7 and T9 are connected in series with each other and are coupled to the transistor T1 in parallel.

The transistors T9 and T10 are connected in series with each other and are coupled to the transistor T2 in parallel. The gate of the transistor T3 is connected to the drain of transistor T9 and the gate of the transistor T4 is connected to the drain of the transistor T10. The transistor T15 is coupled between the gate and source of the transistor T1. Switching elements T11 and T12, which comprise one of the most important feature of the present invention are connected to the memory transistors MT1 and MT2 in parallel, respectively. The switching elements T11 and T12 may be, for example, P-channel MOS transistors.

The MOS transistors T13 and T14 may be P-channel depletion type devices and the other MOS transistors may be P-channel enhancement type devices.

The MNOS transistors MT1 and MT2 may be of such a type that when a positive erasing voltage (for example +25 volts) is applied to the gate relative to the substrate, the gate threshold voltage shifts in the positive direction and when a negative writing voltage (for example −23 volts) is applied to the gate thereof relative to the source, the threshold voltage shifts in the negative direction.

In the illustrated circuit functions of the control signals M, $\phi$ and $\overline{\phi}$ are as follows. The signal M is used for retrieval, erasing and writing of the information in the MNOS transistors. The signal $\phi$ is used to prohibit a count input at the time of retrieval or writing of the information in the MNOS transistors. The signal $\phi$, which is an inverted form of the signal $\phi$, is used to operate the counter circuit according to the present invention as a conventional counter circuit.

Figure 2:
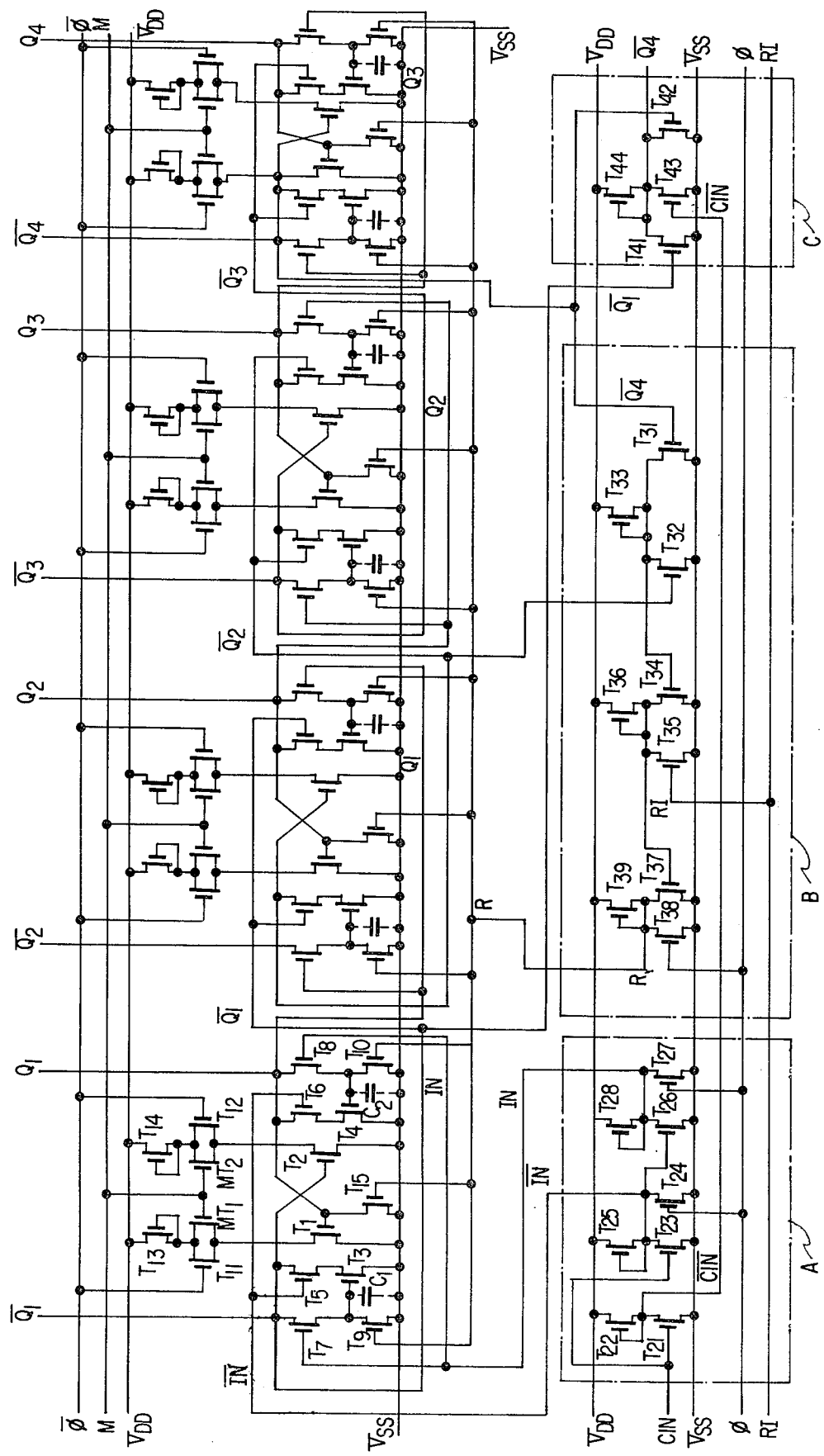
FIG. 2 shows a circuit diagram of a counter circuit using a series of the circuits of FIG. 1.

FIG. 2 shows a circuit diagram of a counting circuit comprising four bit circuits of the type shown in FIG. 1, a count input control circuit A, a count clear circuit B, and a carry circuit C.

The count input control circuit A consists of an inverter circuit formed by a transistor T21 and a load transistor T22, a first NOR circuit formed by transistors T23 and T24 and a load transistor T25 and a second NOR circuit formed by transistors T26 and T27 and a load transistor T28. The transistors T21, T23, T24, T26 and T27 may be enhancement type MOS transistors and the transistors T22, T25, and T28 may be depletion types MOS transistors. The inverter circuit formed by the transistors T21 and T22 generates an output signal $\overline{CIN}$ which is an inverted form of count input signal CIN. The first NOR circuit generates a signal $\overline{IN}$ and transmits the count input through an inverted gate circuit which is closed by the signal $\phi$. The second NOR circuit converts the signal $\overline{IN}$ through an inverted gate circuit which is closed by the signal $\phi$ and generates a signal IN. The signals IN and $\overline{IN}$ correspond to the input signals Qo and $\overline{Qo}$ of the first stage counter respectively.

The count clear circuit B consists of a first NOR circuit formed by transistors T31, T32 and T33, a second NOR circuit formed by transistors T34, T35 and T36 and a third NOR circuit formed by transistors T37, T38 and T39.

The count clear circuit B enables the four digit binary counter to be used as a decimal counter by resetting the four digit binary counter when the value thereof amounts to ten by means of the reset signal RI or a binary-coded decimal code. That is, the output of the first NOR circuit becomes −25 volts when the count information of the binary coded decimal counter is such that: (Q4, Q3, Q2, 1°) = (1, 0, 1, 0) since the transistors T31 and T32 turn off, which in turn causes the transistor T34 to turn on. When the transistor T34 turns on, the output of the second NOR circuit becomes zero, which in turn causes the transistor T37 to turn off. If the input signal $\phi$ is zero, the transistor T38 turns off and therefore the third NOR circuit generates a reset signal R of −25 volts. Thus, the information stored in the binary-coded decimal counter is reset to zero at each count of 10.

Similarly, when the reset signal RI becomes −25 volts, the output of the second NOR circuit becomes zero, which in turn causes the transistor T37 to turn off. If the input signal $\phi$ is zero, the third NOR circuit generates the reset signal R of −25 volts. The input signal $\phi$ prohibits generation of the reset signal RI from the third NOR circuit when the signal $\phi$ is −25 volts.

The carry circuit C generates a carry output when the count input is applied at the time when the count value thereof is 9.

Transistors T41, T42 and T43 and load transistor T44 constitute a three input NOR circuit. When the count value is 9, that is, (Q4, Q3, Q2, Q1) = (1, 0, 0, 1), the carry outputs $\overline{Q4}$ and $\overline{Q1}$ become zero. That is, the transistors T41 and T42 turn off since the gate inputs are zero volts. At this time, if the count input signal CIN becomes −25 volts, the inverted count input signal $\overline{CIN}$ becomes zero, that is, the gate input of the transistor T43 becomes zero. Thus, the transistors T41, T42 and T43 turn off simultaneously and generate the carry output signal $\overline{Q4}$ of −25 volts at the carry output line.

Figure 3:
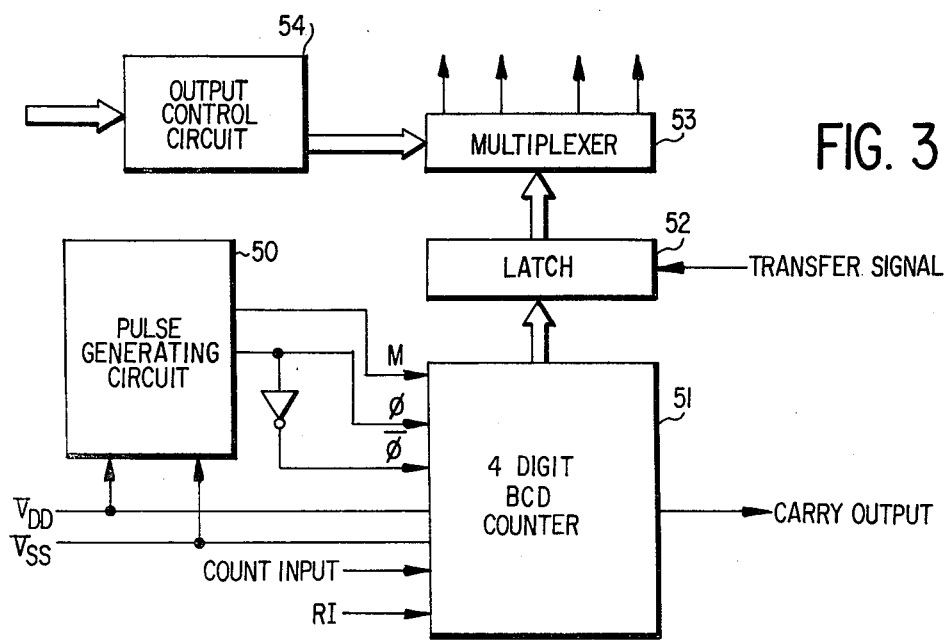
FIG. 3 is a block diagram showing general construction of a nonvolatile counter circuit according to one preferred embodiment of the present invention.

FIG. 3 shows a block diagram of general construction of a nonvolatile counter circuit. The circuit comprises a pulse generating circuit 50, a four digit BCD counter 51, a latch 52, a multiplexer 53 and an output control circuit 54.

One of the features of this invention is the provision of the pulse generating circuit 50, detailed construction of which is explained below.

The pulse generating circuit 50 detects the potential difference between the power source voltage $V_{DD}$ and the ground voltage $V_{SS}$ by detecting the on or off state of the power source to thereby generate the signals M and $\phi$.

Thus, by virtue of the pulse generating circuit 50, the information stored in the MNOS transistors MT1 and MT 2 is returned to the flip-flop when the power source is on, and the information stored in the MNOS transistors is erased. After that, the counter shown in FIG. 1 is operated in the same manner as a conventional counter and the information stored in the flip-flop is written into the MNOS transistors.

The circuit of FIG. 3 functions in the following manner. Assuming the voltages $V_{DD}$ and $V_{SS}$ are supplied to the circuit, the output control circuit 54 is controlled by an input signal, which in turn controls the multiplexer 53 thereby generating one digit of information stored in the latch 52 from the multiplexer 53. The latch 52 stores the information of the four digit BCD counter 51 at the time when a transfer signal is applied. A carry output is generated when the information stored in the counter 51 changes from 9999 to 0000. The BCD counter 51 changes its information to 0000 upon being reset compulsorily by the signal R and increases its count value sequentially by one as the count input pulse are received.

Figure 4:
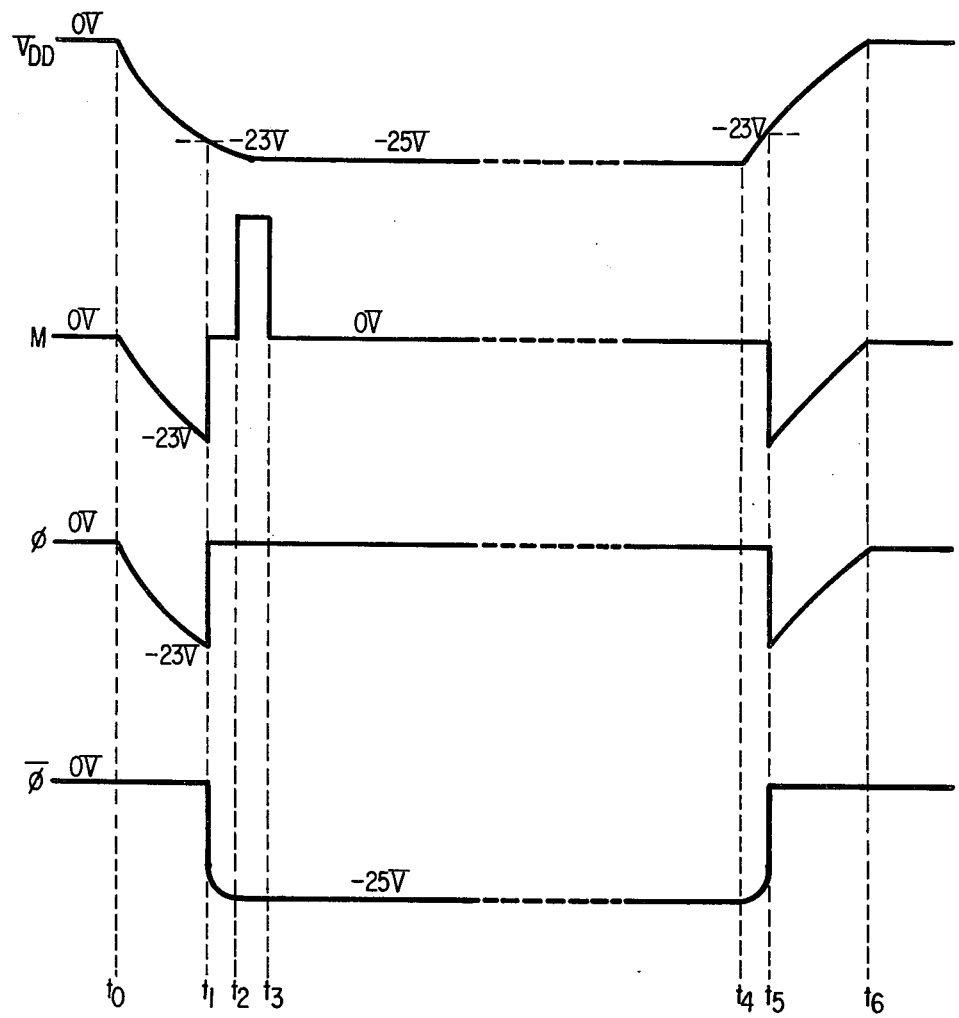
FIG. 4 shows a timing diagram for the operation of the nonvolatile counter circuit of FIGS. 1 and 2 to illustrate the operation thereof.

With a stable power supply, the MOS counter operation can be carried out. The pulse generating circuit 50 generates the signals M and $\phi$ shown in FIG. 4 when it detects turning on or turning off of the power by detecting the potential difference between $V_{DD}$ and $V_{SS}$. When the power is turned off, the pulse generating circuit 50 generates the output signals M and $\phi$ as shown in FIG. 4 (between the times $t4$ and $t6$). The signal $\phi$ causes the counting operation of the BCD counter 51 to stop. The information stored in the flip-flop of the BCD counter 51 is written into the MNOS memory transistors MT1 and MT2 by the signal M. When the power is turned on, the pulse generating circuit 50 generates the output signals M and $\phi$ as shown in FIG. 4 (between the times t0 and t3).

The signal $\phi$ causes the counting operation of the BCD counter 51 to stop and the signal $\overline{\phi}$ enables reading of the information stored in the MNOS memory transistors MT1 and MT2. The information is then read out and returned to the flip-flop of the BCD counter 51 by the signal M.

Now, writing, erasing and retrieving operations of the information will be explained in more detail in conjunction with FIG. 1 and FIG. 4

For convenience of explanation the following suppositions will be made. The threshold voltage of the MNOS transistors MT1 and MT2 after applying the positive erasing voltage is −2 volts and after applying the negative writing voltage is −6 volts. The threshold voltage of the MOS transistors T13 and T14 is +5 volts and of the other MOS transistors T1 to T12 and T15 is −3 volts.

Also the condition that the information "1" is stored in the MNOS transistors MT1 and MT2 is assumed to be the condition when the threshold voltage of the MNOS transistors MT1 is −6 volts and of the transistors MT2 is −2 volts. If the threshold voltages of the MNOS transistors MT1 and MT2 are in opposite relationships with respect to the above condition, such condition will be assumed to be a "0" state.

When the information stored in the MNOS transistors MT1 and MT2 is erased, the threshold voltage thereof will be assumed to be −2 volts.

First, consider the condition when $V_{DD} = 0$ volt, that is the power supply is off. Let it also be assumed that in the beginning, the information "1" is stored in the MNOS transistors MT1 and MT2 (i.e. the threshold voltages of the transistors MT1 and MT2 are −6 volts, −2 volts respectively) and the power source turns on at the time $t0$. The normal power source voltage $V_{DD}$ is −25 volts and the detecting level of "ON" or "OFF" states is assumed to be −23 volts.

It is also assumed that the power source voltage reaches the detecting level −23 volts at time $t1$. During the times $t0$ and $t1$, the signals M and $\phi$ generated from the pulse generating circuit 50 follow the power source voltage $V_{DD}$ as shown in FIG. 4. Therefore, the MOS transistors T11 and T12 which are supplied the signal $\overline{\phi}$ at their gates maintain an off state. However, the below described voltages will arise at the output lines Qi and $\overline{Qi}$ with the increase of power source potential since the signal M is applied to the gate of the MNOS transistors MT1 and MT2.

For example, when the power source voltage $V_{DD}$ goes to −6 volts, the signal M also becomes −6 volts, so zero volt will arise at the output line $\overline{Qi}$ and −4 volts will arise at the output line Qi. At this time, the MOS transistor T1 is turned on by the output Qi, however, the MOS transistor T2 is still held in its off state. When the power source voltage $V_{DD}$ increases further, the output of the flip-flop formed by the MOS transistors T1, T2, T13 and T14 and the MNOS transistors MT1 and MT2 becomes, Qi = −20 volts and $\overline{Q}$ = 0 volt since the MOS transistor T1 is on and the MOS transistor T2 is off. That is, the flip-flop returns to the "1" state. When turning on of the power source is detected at the time $t1$ and the signals M and $\phi$ return to zero volt, the signal $\overline{\phi}$ becomes the power source voltage $V_{DD}$ which in turn causes the MOS transistors T11 and T12 to turn on. Therefore, the flip-flop includes the MOS transistors T1, T2, T11, T12, T13 and T14 since the MNOS transistors MT1 and MT2 are short-circuited. The information "1" in the flip-flop is still stored therein.

Between the time $t2$ and $t3$, the pulse generating circuit 50 generates a positive pulse (+25 volts) which in turn erases the information stored in the MNOS transistors MT1 and MT2. After the time $t1$, the counter circuit is operated only by the MOS transistors and is the same as a conventional counter circuit except for the MOS transistors T11 and T12. Therefore, the counter circuit can be operated in the well known conventional mode.

Misoperation of the counter circuit at the time of on and off switching of the power source can be prevented by restricting count inputs IN and $\overline{IN}$ to the first stage and by holding reset signals R to zero volt using the signal $\phi$ at the input control circuit A and reset circuit B.

It is understood that in the case when the information "0" is stored in the MNOS transistors MT1 and MT2 at the beginning, the information is returned to the flip-flop when the power source turns on in accordance with the process explained above.

The writing of the information stored in the flip-flop into the MNOS transistors at the time when the power source turns off will now be explained in more detail.

As shown in FIG. 4, the power source turns off at the time $t4$ and the voltage $V_{DD}$ thereof becomes −23 volts at the time $t5$. At the time $t5$, the turning off of the power source is detected by the pulse generating circuit 50. After the time $t5$ the pulse generating circuit 50 generates the signals M and $\phi$ which follow the power source $V_{DD}$ as shown in FIG. 4. As clearly understood from the FIG. 2, the signal $\phi$ is supplied to the count input control circuit A and the count clear circuit which in turn prohibits all the counting and reset functions after the time $t5$. Therefore, the information stored in the flip-flop just before the time $t5$ is written into the MNOS transistors MT1 and MT2, that is, the signal which follows the power source voltage $V_{DD}$ is applied to the MNOS transistors MT1 and MT2 after the time $t5$. If the information stored in the flip-flop is assumed to be "1" and if the output Q1 is at −20 volts, $\overline{Q1}$ is at zero volt and the signal M is at −23 volts. The threshold voltage of the MNOS transistor MT1 then shifts in the negative direction and becomes −6 volts, however, the threshold voltage of the MNOS transistor MT2 is still held at −2 volts since −23 volts is applied to the gate of the MNOS transistor MT1 and less than −3 volts is applied to the gate of the MNOS transistor MT2 with respect to the source thereof.

Thus, the information "1" stored in the flip-flop is written into the MNOS transistors MT1 and MT2.

In the same manner, the information "0" stored in the flip-flop is written into the MNOS transistors MT1 and MT2. This information stored in the MNOS transistors MT1 and MT2 is stored nonvolatilely until the power source is turned on again.

As explained above, according to the present invention, the switching elements T11 and T12 are provided in parallel to the memory transistors MT1 and MT2 respectively. During the normal operation of the power source, both ends of the memory transistors MT1 and MT2 are shorted, therefore, the circuit is operated as a conventional counter without memory transistors. However, in case the power source turns off, this fact is detected, and the information stored in the flip-flop is written into the memory transistors where it is stored nonvolatilely.

If the power source turns on, the information is returned to the flip-flop and, when both ends of the memory transistors are again shorted the circuit is operated as a conventional counter and then the information stored in the memory transistors is erased.

Therefore, according to the present invention, the deterioration of the memory transistor is lessened and the reliability thereof is improved greatly in comparison with the conventional nonvolatile counter circuits in which information is rewritten into the memory transistor at every count input.

Further, according to the present invention, lowering of operating speed due to utilizing of the memory transistors is virtually eliminated. Also, a stable operation of the circuit is possible for preventing misoperation of the circuit due to fluctuations of the power source since counting and reset functions are prohibited at the transition period when the power source turns on or off.

Figure 5:
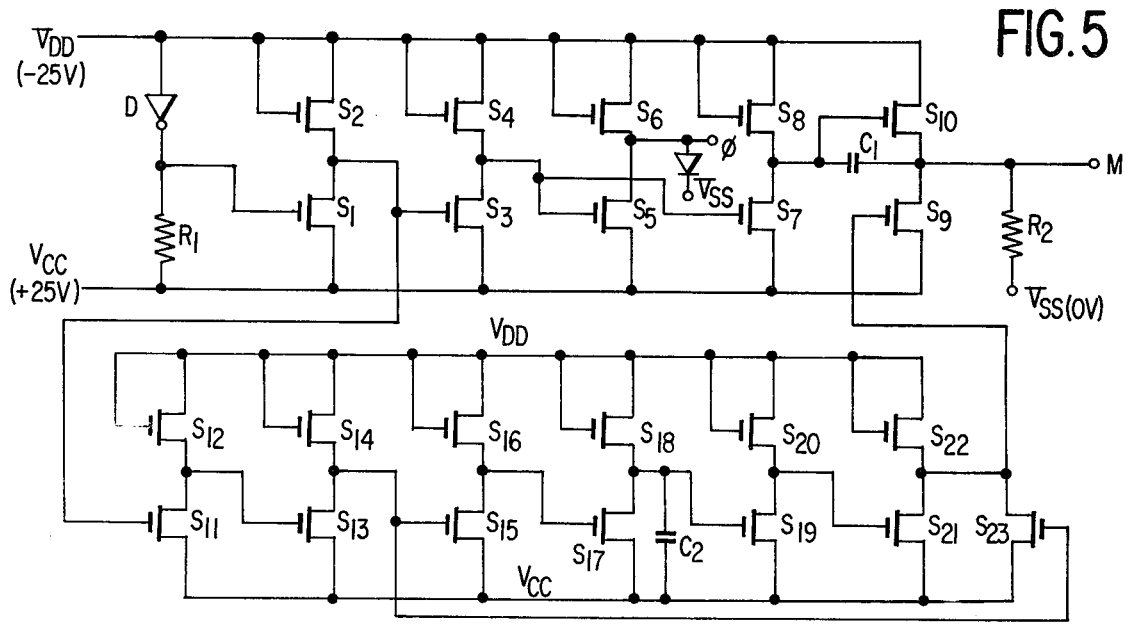
FIG. 5 is a circuit diagram of the pulse generating circuit shown in block form in FIG. 3.

One preferred embodiment of the pulse generating circuit 50 which generates the signals M and $\phi$ is shown in FIG. 5. The circuit 50 comprises MOS transistors S2, S4, S6, S8, S12, S14, S16, S18, S20 and S22 having their gates and drains connected to a power source, designated $V_{DD}$, and the sources thereof connected to drains of MOS transistors S1, S3, S5, S7, S11, S13, S15, S17, S19 and S21. The sources of the MOS transistors S1, S3, S5, S7, S11, S13, S15, S17, S19 and S21 are coupled to power source $V_{CC}$.

The drain of MOS transistor S10 is connected to the power sources $V_{DD}$ and the gate thereof is connected to the source region of the transistor S8. The source of the transistor S10 is connected to the drain of the transistor S9 and the source of the transistor S9 is connected to the power source $V_{CC}$.

The gate of the transistor S9 is connected to drain of MOS transistor S23 and its source is connected to the power source $V_{DD}$. The MOS transistors S1 to S23 may be, for example, devices of the P-channel enhancement type. A constant voltage diode D is inserted between the gates of the transistors S1 and S2. However, the diode D may be replaced by a resistor.

A resistor R1 is connected at one terminal to the gate of the transistor S1 and at the other terminal to the power source $V_{CC}$. A source of the transistor S2 is coupled to the drain of the transistor S1 and to a gate of the transistors S3 and S11.

Gates of the transistors S5 and S7 are tied together and connected to the drain of the transistor S3. Gates of the transistors S13, S15, S17, S19 and S21 are connected to the drains of the transistors S11, S13, S15, S17 and S19 respectively. A capacitor C1 is inserted between the sources of the transistors S8 and S10 and a capacitor C2 is inserted between the drain and source of the transistor S17. The operation of the circuit is as follows.

Briefly, the circuit generates the signals M and $\phi$ as shown in FIG. 4 after detecting on or off states of the power source by the constant voltage diode D and the resistor R1. At the time $t0$ (FIG. 4), the transistors S1, S5, S7 and S9 are off since the power source voltage $V_{DD} = 0$. Between the times $t0$ and $t1$, the transistors S1, S5 and S7 are still held off until the constant voltage diode D conducts, even if the power source voltage recovers. Therefore, the signals M and $\phi$ which follow the power source voltage are obtained from the drain of the transistors S5 and S7. If the power source voltage $V_{DD}$ reaches a predetermined level, for example the detecting level −23 volts, the constant voltage diode D conducts which in turn cause the transistors S1, S5 and S7 to turn on so that the signals M and $\phi$ become zero volt. The MOS transistors S11 and S23 constitute a delay circuit which causes the signal M to generate a positive pulse during the time between $t2$ and $t3$. That is, a delay time ($t2 - t1$) is obtained through the transistors S15, S17, S19 and S21. More specifically, the transistor S23 is on during the time between $t1$ and $t2$, which in turn causes the transistor S9 to turn off. Therefore, the signal M is zero volt. At the time $t2$, the transistor S13 turns on, causing the transistor S23 to turn off and the transistors S9 to turn on thereby the positive pulse M of +25 volts is obtained at the drain of the transistor S9. At the time $t3$, the transistor S21 turns on, which in turn causes the transistor S9 to turn off whereby the drain potential returns to zero volt. Therefore, a positive pulse M having pulse width ($t2 - t3$) is obtained.

Figure 6:
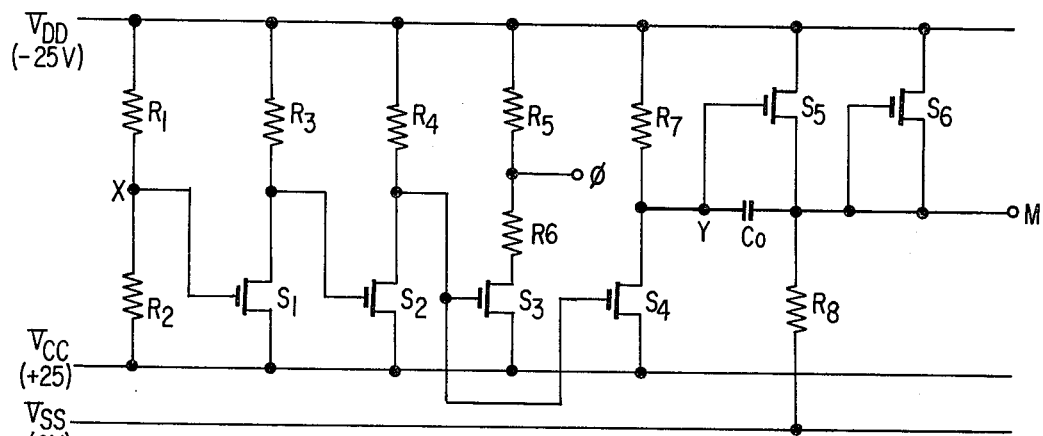
FIG. 6 is a modification of the circuit shown in FIG. 5.
Figure 7:
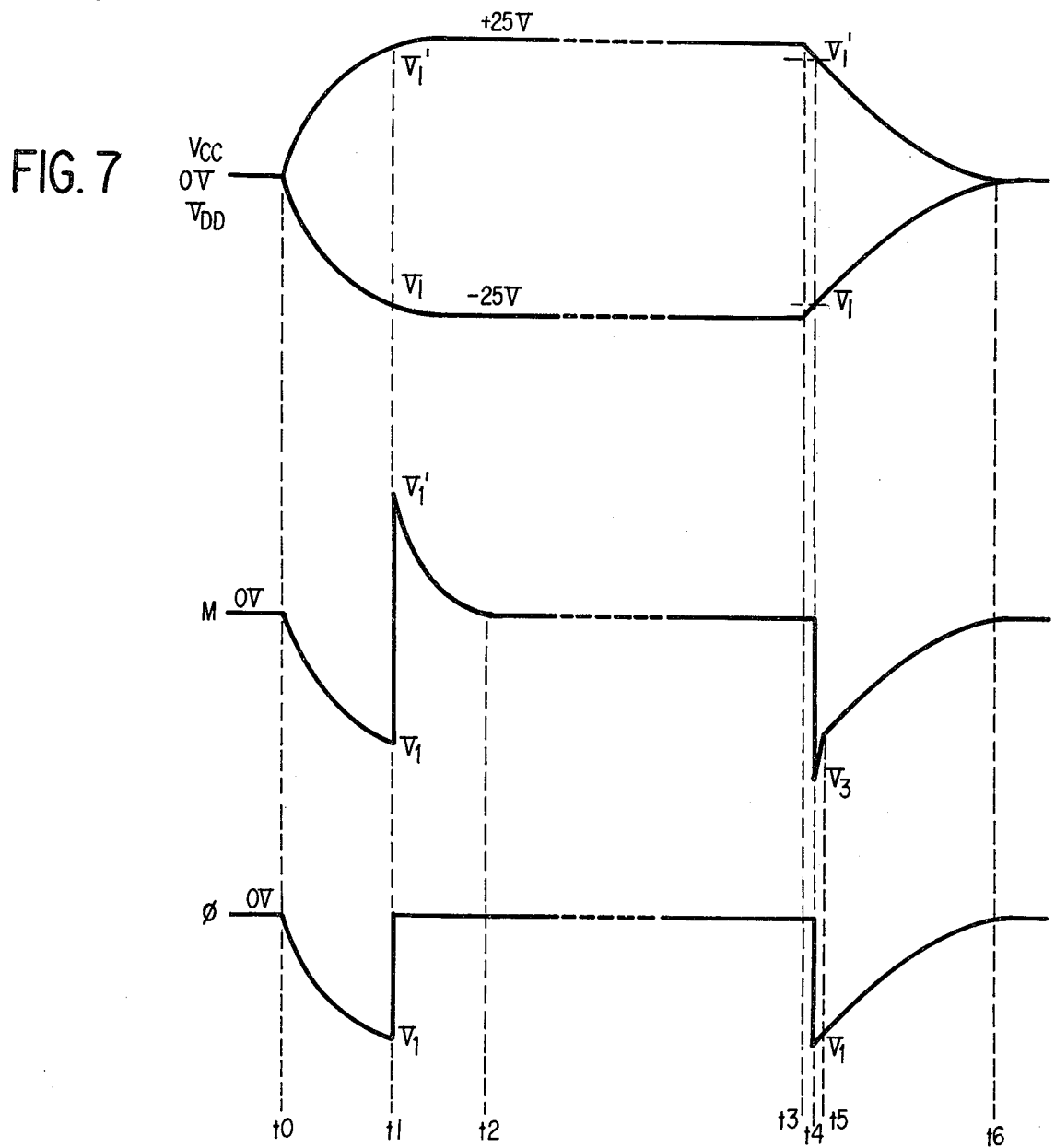
FIG. 7 is a timing diagram showing the operation of the pulse generating circuit of FIG. 5.

FIG. 6 shows another embodiment of the pulse generating circuit which is more simplified than the one shown in FIG. 5. The illustrated circuit comprises resistors R1, R2, R3, R4, R5, R6, R7 and R8, MOS transistors S1, S2, S3, S4, S5, and S6 and a capacitor C1. Briefly, the detection of on or off states of the power source is carried out by the resistors R1 and R2. Signals M and $\phi$ as shown in FIG. 7 are generated by the transistors S1 to S6.

The circuit of FIG. 6 functions in the following manner. When the power source $V_{DD}$ is off, that is until the time $t0$ (FIG. 7), the transistors S1 to S6 are off. During the time between $t0$ and $t1$, the transistors S1, S3, S4 and S6 are off. Therefore, signals $\phi$ and M which follow the power source voltage $V_{DD}$ are obtained from the terminal $\phi$ and M respectively. When the power source voltage reaches $V_1$ and $V_1'$, the transistor S1 turns on since the potential at point X reaches the threshold voltage $V_{th}$ of the transistors S3 and S4 to turn on. When the transistor S3 turns on, approximately zero volt appears at the terminal $\phi$ by virtue of the resistance divider R5 and R6 plus the internal resistance of the transistor S3. When the transistor S4 turns on, the potential at point Y changes abruptly from $V_1$ to $V_1'$. This change in turn causes the potential of terminal M to change from $V_1$ to $V_1'$. The waveform of the signal M between the time $t1$ and $t2$ is determined by the time constant of the capacitor C0 and the resistor R8. At the time $t2$, the signal M is caused to be zero volt by the resistor R8.

Now, assume that the power source is turned off at time $t3$ and it becomes zero volt at time $t6$. Some period of time $t3$ to $t6$, is necessary for the power source voltage to become zero volt after it is turned off on account of the capacity of the power source. The signals M and $\phi$ hold at the zero level until the power source voltage becomes $V_1$ and $V_1'$ (at time $t4$) after it is turned off (at time $t3$). However, at time $t4$, the transistor S1 turns off because the potential at point X drops lower than the threshold voltage of the transistor S1, which in turn causes the transistor S3 and S4 to turn off. When the transistor S3 turns off, the signal $\phi$ changes the same as the changes in the power source voltage $V_{DD}$ and finally becomes zero volt. Turning off the transistor S4 causes an abrupt change, for example from $V_1$ to $V_1'$, in the potential at point Y. Then the voltage of the signal M changes from zero volt to the amount of change of the voltage at point Y and becomes voltage $V_3$, which is lower than voltage $V_1$. At this time, the voltage $V_3$ of the signal M is restricted to the voltage value $V_1$ plus the threshold voltage of the transistor S6 by the transistor S6. The time between $t4$ and $t5$ is determined by the time constant of C0 and R8.

When the transistor S4 turns off, causing the transistor S5 to turn on, the potential of the signal M after time $t5$ follows the power source voltage $V_{DD}$.

While the invention has been particularly shown and described with reference to a preferred embodiment thereof, it will be understood by those skilled in the art that changes in form and details may be made therein without departing from the spirit and scope of the invention. For example, a MNOS transistor was used as a nonvolatile memory element. It should be understood that other nonvolatile insulated gate type field effect memory transistors such as MAOS (Metal-$Al_2O_3$-$SiO_2$-Semiconductor) transistors, are equally suitable for use in the present invention.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A nonvolatile counter circuit, comprising:
   a power supply;
   flip-flop circuit means for temporarily storing information coupled to said power supply;
   a nonvolatile insulated gate type field effect memory transistor coupled to said flip-flop circuit;
   a switching element coupled in parallel with said nonvolatile memory transistor;
   transferring means coupled to said power supply for sensing a first state of said power supply and for transferring information stored in said nonvolatile memory transistor to said flip-flop circuit means upon detecting said first state of said power supply;
   erasing means coupled to said nonvolatile memory transistor for erasing information stored therein;
   short circuiting means coupled to said switching element for rendering said switching element conductive and
   writing means coupled to said power supply for writing information stored in said flip-flop circuit means into said nonvolatile memory transistor upon detecting a second state of said power supply.

2. A nonvolatile counter circuit according to claim 1 wherein:
   said nonvolatile memory transistor is a MNOS transistor.

3. A nonvolatile counter circuit according to claim 1 wherein:
   said nonvolatile memory transistor is a MAOS transistor.

4. A nonvolatile counter circuit according to claim 1 wherein:
   said switching element is a field effect transistor.

5. A nonvolatile counter circuit according to claim 4 wherein:
   said field effect transistor is a MOS transistor.

6. A nonvolatile counter circuit according to claim 1 wherein said flip-flop circuit means comprises:
   a plurality of field effect transistors, each having source, drain and gate electrodes;
   a first load transistor having its drain connected to said power supply and having its source and gate electrodes coupled together;
   a first storage transistor having its drain connected to the source of said load transistor;
   a second load transistor having its drain connected to said power supply and having its source and gate electrodes coupled together;
   a second storage transistor having its drain connected to the source of said second load transistor;
   a fifth transistor having its drain connected to the source of said first storage transistor, having its source connected to ground and having its gate connected to the source of said second storage transistor;
   a sixth transistor having its drain connected to the source of said second storage transistor, having its source connected to ground and having its gate connected to the source of said first storage transistor;
   a first switching transistor connected in parallel with said first storage transistor;
   a second switching transistor connected in parallel with said second storage transistor; and wherein
   the gates of said first and second storage transistors being connected together for common application of a first control signal and the gates of said first and second switching transistors adapted to be fed by a second control signal.

7. A nonvolatile counter circuit as in claim 1, further comprising:
   a count input control circuit;
   a count clear circuit; and
   a carry circuit.

8. A nonvolatile counter circuit as in claim 7, wherein said count input control circuit includes:
   an inverter circuit, and first and second NOR circuits.

9. A nonvolatile counter circuit as in claim 8 wherein said count clear circuit includes:
   three interconnected NOR circuits.

10. A nonvolatile counter circuit as in claim 7, further comprising:
    a pulse generating circuit, said pulse generating circuit coupled to said power supply to said count input control circuit and to said count clear circuit, whereby all counting functions are prevented when said power supply is switching from said first state to said second state.

11. A nonvolatile counter circuit as in claim 1, wherein said switching element comprises:
   a field effect transistor coupled across the source and drain of said memory transistor whereby said switching element is adapted to short circuit said memory transistor.

12. A nonvolatile counter circuit as in claim 1, further comprising circuit means for inhibiting counting operations of said counter circuit during operation of said transferring means.

13. A nonvolatile counter circuit as in claim 1, further comprising:
   a second memory transistor coupled to said flip-flop circuit; and
   a second switching element coupled across said second memory transistor whereby said second switching element is adapted to short circuit said second memory transistor.

* * * * *